(12) United States Patent
Kim et al.

(10) Patent No.: US 8,710,497 B2
(45) Date of Patent: Apr. 29, 2014

(54) ARRAY SUBSTRATE INCLUDING THIN FILM TRANSISTOR AND METHOD OF FABRICATING THE SAME

(75) Inventors: Jung Han Kim, Seoul (KR); Chi-Wan Kim, Suncheon-si (KR); Jeremy T. Anderson, Corvallis, OR (US); Kai Jiang, Corvallis, OR (US)

(73) Assignees: LG Dispay Co., Ltd, Seoul (KR); Inpria Corporation, Corvallis, OR (US)

( * ) Notice: Subject to any disclaimer, the term of this patent is extended or adjusted under 35 U.S.C. 154(b) by 90 days.

(21) Appl. No.: 13/315,049

(22) Filed: Dec. 8, 2011

(65) Prior Publication Data

US 2013/0146862 A1    Jun. 13, 2013

(51) Int. Cl.
*H01L 29/10* (2006.01)
*H01L 29/12* (2006.01)

(52) U.S. Cl.
USPC ........................................................ 257/43

(58) Field of Classification Search
USPC ........... 257/43, 223, 227, 291, 292, 439, 443, 257/655, E27.1, E27.125, E27.112, 257/E29.117, E29.145, E29.147, E29.151, 257/E29.182, E29.202, E29.273–E29.299, 257/E29.314, E29.32, E23.016, E21.094, 257/E21.104, E21.121, E21.372, 257/E21.411–E21.416, 252–254, 257–258; 438/149, 22, 24, 48

See application file for complete search history.

(56) References Cited

U.S. PATENT DOCUMENTS

| | | | |
|---|---|---|---|
| 7,773,365 B2 | 8/2010 | Herman et al. | |
| 2005/0242330 A1* | 11/2005 | Herman et al. | 252/570 |
| 2010/0025677 A1* | 2/2010 | Yamazaki et al. | 257/43 |
| 2010/0065841 A1* | 3/2010 | Lee et al. | 257/43 |
| 2011/0193076 A1* | 8/2011 | Yun et al. | 257/43 |
| 2011/0297930 A1* | 12/2011 | Choi et al. | 257/43 |

\* cited by examiner

*Primary Examiner* — Dao H Nguyen
*Assistant Examiner* — Tram H Nguyen
(74) *Attorney, Agent, or Firm* — Birch, Stewart, Kolasch & Birch, LLP

(57) ABSTRACT

An array substrate includes: a substrate; a gate line and a gate electrode on the substrate; a gate insulating layer on the gate line and the gate electrode, the gate insulating layer including a first insulator and a second insulator on the first insulator, wherein the first insulator includes an aluminum oxide material and has a first thickness, and the second insulator includes a hafnium oxide material and has a second thickness; an oxide semiconductor layer on the gate insulating layer over the gate electrode; a data line over the gate insulating layer; a source electrode and a drain electrode contacting the oxide semiconductor layer; a passivation layer on the data line, the source electrode and the drain electrode; and a pixel electrode on the passivation layer, the pixel electrode connected to a drain electrode through a drain contact hole.

22 Claims, 14 Drawing Sheets

ARRAY SUBSTRATE INCLUDING THIN FILM TRANSISTOR AND METHOD OF FABRICATING THE SAME

BACKGROUND OF THE INVENTION

1. Field of the Invention

The present invention relates to an array substrate, and more particularly, to an array substrate including a thin film transistor having an improved stability in an electric property and a method of fabricating the array substrate.

2. Discussion of the Related Art

As the information age has progressed, display devices processing and displaying a large amount of information have been rapidly developed. Recently, flat panel display (FPD) devices such as a liquid crystal display (LCD) device, an organic light emitting diode (OLED) device, and an electrophoretic display device having the characteristics of thin profile, light-weight, and low power consumption have been developed to substitute for a cathode ray tube (CRT).

Among LCD devices, an active matrix type LCD device including an array substrate, where a thin film transistor that is a switching element controlling on and off of a voltage in each pixel region is formed, has been widely used because of its superiority in resolution and quality of displaying moving images. Further, the OLED device has a high brightness and a low driving voltage and is an emissive type that emits a light for itself. Accordingly, the OLED device has a high contrast ratio and a very thin profile. In addition, the OLED device has a good quality in displaying moving images because of a short response time of several micro seconds. The OLED device has no limitation in a viewing angle and is stably driven at a relatively low temperature. Since the OLED device is driven by a low DC voltage of about 5V to about 15V, it is easy to fabricate and design a driving circuit. The electrophoretic display device has been widely developed as a next-generation display device because of excellent contrast ratio, high brightness, low cost, and portability.

Each of the LCD device, the OLED device, and the electrophoretic display device includes an array substrate where a thin film transistor (TFT) is formed as a switching element to control the on and off states of a pixel region. Since a glass substrate is used for the array substrate of the display devices to tolerate the high temperature in the fabrication process, the display device has limitations in weight, profile, and flexibility. Accordingly, a flexible, thin display device including a substrate of a flexible material such as plastic instead of a glass substrate has been widely researched.

Since a flexible substrate such as a plastic substrate is inferior to a glass substrate in heat stability, the fabrication process for an array substrate using a flexible substrate is performed at a temperature lower than about 350° C. However, when a semiconductor material such as silicon is formed at a temperature lower than about 350° C. a semiconductor layer of the semiconductor material is degraded in electrical characteristics because of a low density. As a result, a thin film transistor including the semiconductor layer formed in a temperature lower than about 350° C. may not be used as a switching element.

To solve the above problems, an oxide semiconductor material that has an excellent semiconductor property even when it is formed in a temperature lower than about 350° C. has been developed. When a thin film transistor is fabricated by using an oxide semiconductor material, an oxide semiconductor material layer is stably formed at a temperature lower than about 350° C. In addition, since an ohmic contact layer is not required, the oxide semiconductor layer is not exposed to a dry etching gas, preventing deterioration of the properties of the thin film transistor.

In the array substrate including the oxide semiconductor layer, however, the property of the thin film transistor depends on the quality of a gate insulating layer that constitutes an interface with the oxide semiconductor layer. When the oxide semiconductor layer is formed through a sputtering method, the gate insulating layer may be formed of silicon oxide or silicon nitride through a chemical vapor deposition (CVD) method. When the oxide semiconductor layer is formed of a soluble oxide semiconductor material, the gate insulating layer may be formed of a soluble aluminum oxide material. For example, an aluminum oxide material layer may be formed on a substrate by coating a soluble aluminum oxide material and the substrate having the aluminum oxide material layer may be heated through a hardening step at a temperature of about 350° C.

When a positive bias temperature stress (PBTS) test as a reliability test is performed for the array substrate having a thin film transistor including the gate insulating layer of the soluble aluminum oxide material and the oxide semiconductor layer, a threshold voltage of the thin film transistor moves toward a negative voltage direction. In addition, when a negative bias temperature stress (NBTS) test is performed for the array substrate having the thin film transistor, the threshold voltage of the thin film transistor shifts along a positive voltage direction.

The negative and positive shifts of the threshold voltage in the PBTS and NBTS tests are caused by a relatively low density of the gate insulating layer of the thin film transistor. Since dehydration in the gate insulating layer of the soluble aluminum oxide material is not sufficiently performed by the hardening step of a temperature of about 350° C. a solvent in the gate insulating layer of the soluble aluminum oxide material is not sufficiently removed even after the hardening step. As a result, the gate insulating layer of the soluble aluminum oxide material has a relatively low density and there exists a large quantity of localized defects and mobile charges in the gate insulating layer. Accordingly, the property of the thin film transistor including the oxide semiconductor layer deteriorates under operation, as evidenced by shifts in the threshold voltage.

SUMMARY OF THE INVENTION

Accordingly, the present invention is directed to an array substrate including a thin film transistor and a method of fabricating the same that substantially obviate one or more of the problems due to limitations and disadvantages of the related art.

An advantage of the present invention is to provide an array substrate including a thin film transistor that has a stable switching property without a threshold voltage shift and a method of fabricating the array substrate.

Another advantage of the present invention is to provide an array substrate including a thin film transistor that has an excellent current-voltage property through a hardening step at a temperature of about 350° C.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an array substrate includes: a substrate; a gate line and a gate electrode on the substrate, the gate electrode connected to the gate line; a gate insulating layer on the gate line and the gate electrode, the gate insulating layer including a first insulator and a second insulator on the first insulator, wherein the first insulator includes an aluminum oxide material and has a first thickness, and the second insulator includes a hafnium oxide material and has a second thickness; an oxide semiconductor layer on the gate insulating layer over the gate electrode; a data line over the gate insulating layer, the data line crossing the gate line to define a pixel region; a source electrode and a drain electrode contacting the oxide semiconductor layer, the source electrode and the drain electrode spaced apart from each other; a passivation layer on the data line, the source electrode and the drain electrode, the passivation layer having a drain contact hole exposing the drain electrode; and a pixel electrode on the passivation layer, the pixel electrode connected to the drain electrode through the drain contact hole.

In another aspect, a method of fabricating an array substrate includes: forming a gate line and a gate electrode on a substrate, the gate electrode connected to the gate line; forming a gate insulating layer on the gate line and the gate electrode, the gate insulating layer including a first insulator and a second insulator on the first insulator, wherein the first insulator includes an aluminum oxide material and has a first thickness, and the second insulator includes a hafnium oxide material and has a second thickness; forming an oxide semiconductor layer on the gate insulating layer over the gate electrode; forming a data line, a source electrode and a drain electrode over the gate insulating layer, the data line crossing the gate line to define a pixel region, the source electrode and the drain electrode contacting the oxide semiconductor layer and spaced apart from each other; forming a passivation layer on the data line, the source electrode and the drain electrode, the passivation layer having a drain contact hole exposing the drain electrode; and forming a pixel electrode on the passivation layer, the pixel electrode connected to the drain electrode through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, similar reference numbers will be used to refer to the same or similar parts.

Figure 1:
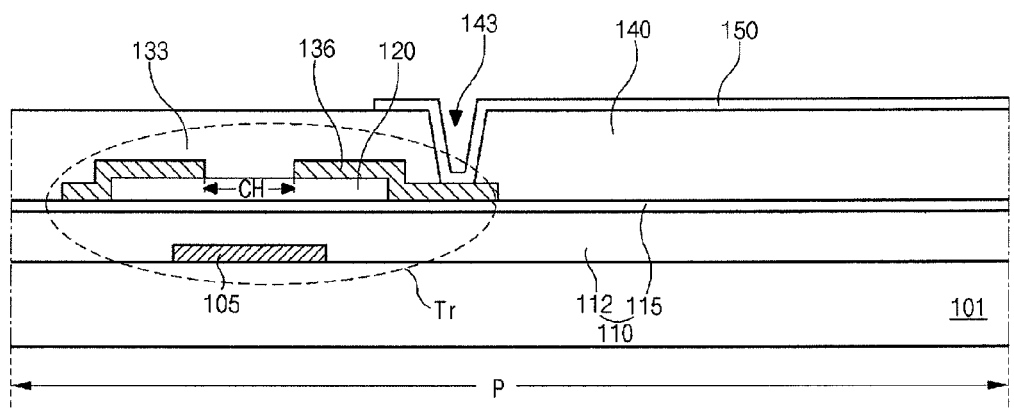
FIG. 1 is a cross-sectional view showing an array substrate including a thin film transistor according to a first embodiment of the present invention.

FIG. 1 is a cross-sectional view showing an array substrate including a thin film transistor according to a first embodiment of the present invention.

In FIG. 1, a gate line (not shown) and a gate electrode 105 connected to the gate line are formed on a substrate 101 such as a glass substrate and a plastic substrate. The gate line may be disposed at a boundary of a pixel region P and the gate electrode 105 may be disposed in the pixel region P.

In addition, a gate insulating layer 110 is formed on the gate line and the gate electrode 105. The gate insulating layer 110 may have a capacitance density within a range of about 10 $nF/cm^2$ to about 30 $nF/cm^2$. The gate insulating layer 110 has a double-layered structure including a first insulator 112 and a second insulator 115 on the first insulator 112. The first insulator 112 may include an aluminum oxide material such as $Al_2(PO_4)_{2-x}O_{3x/2}$ ($0 \leq x \leq 1.5$). In addition, the first insulator 112 may have a dielectric constant within a range of about 4 to about 6 and may have a thickness within a range of about 100 nm to about 400 nm. The second insulator 115 may include a hafnium oxide material such as $HfO_{2-x}(SO_4)_x$ ($0.2 \leq x \leq 1$). In addition the second insulator 115 may have a dielectric constant within a range of about 9 to about 12 and may have a thickness within a range of about 10 nm to about 70 nm. Since the second insulator 115 is much thinner as compared with the first insulator 112, a gate insulating layer 110 may have a dielectric constant within a range of about 4 to 6.

An oxide semiconductor layer 120 is formed on the gate insulating layer 110 over the gate electrode 105. The oxide semiconductor layer 120 may include an oxide semiconductor material such as a zinc oxide (ZnO) material. For example, the zinc oxide material may include one of indium gallium zinc oxide (IGZO), zinc tin oxide (ZTO) and zinc indium oxide (ZIO).

Further, a data line (not shown) is formed on the gate insulating layer 110 and source and drain electrodes 133 and 136 are formed on the oxide semiconductor layer 120. The data line may be disposed at the boundary of the pixel region P such that the gate line and the data line cross each other to define the pixel region P. The source and drain electrodes 133 and 136 are spaced apart from each other and the source electrode 133 is connected to the data line.

The gate electrode 105, the gate insulating layer 110, the oxide semiconductor layer 120, the source electrode 133 and the drain electrode 136 constitute a thin film transistor (TFT) Tr. Since the oxide semiconductor layer 120 is formed under the source and drain electrodes 133 and 136, the TFT Tr has a top contact type where a top surface of the oxide semiconductor layer 120 contacts bottom surfaces of the source and drain electrodes 133 and 136.

Although the source and drain electrodes 133 and 136 are formed on the oxide semiconductor layer 120 in FIG. 1, the source and drain electrodes may be formed on the oxide semiconductor layer with an etch stopper interposed therebetween in another embodiment.

Figure 2:
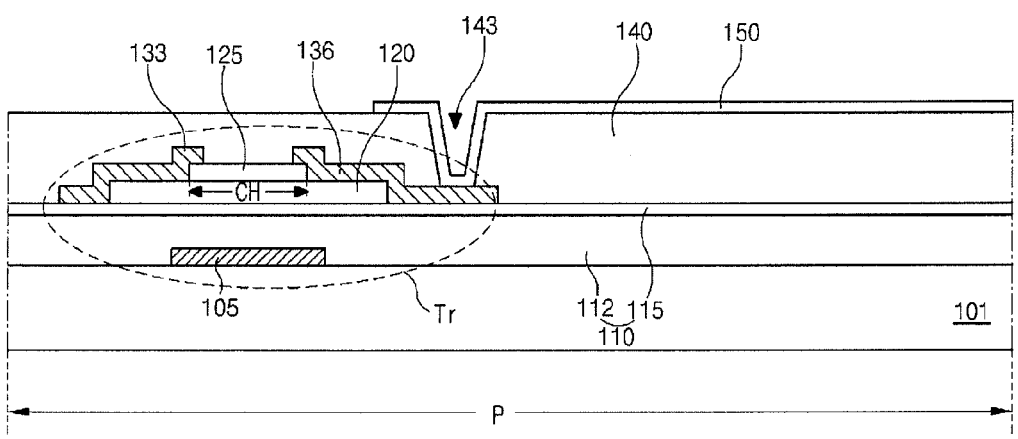
FIG. 2 is a cross-sectional view showing an array substrate including a thin film transistor according to a second embodiment of the present invention.

FIG. 2 is a cross-sectional view showing an array substrate including a thin film transistor according to a second embodiment of the present invention. Illustration for the same part of the second embodiment as the first embodiment will be omitted.

In FIG. 2, an etch stopper 125 is formed on an oxide semiconductor layer 120, and source and drain electrodes 133 and 136 are formed on the etch stopper 125. The etch stopper 125 may be disposed on a central portion of the oxide semiconductor layer 120 to contact the oxide semiconductor layer 120 and may have an island shape of an insulating material. The source and drain electrodes 133 and 136 are spaced apart from each other on the etch stopper 125 and contact side portions of the oxide semiconductor layer 120 exposed outside the etch stopper 125.

In FIGS. 1 and 2, a passivation layer 140 is formed on the data line and the source and drain electrodes 133 and 136, and a pixel electrode 150 is formed on the passivation layer 140. The passivation layer 140 includes a drain contact hole 143 exposing the drain electrode 136, and the pixel electrode 150 is connected to the drain electrode 136 through the drain contact hole 143.

In the array substrate according to the first and second embodiments of the present invention, since an ohmic contact layer for ohmic contact is not formed between the oxide semiconductor layer 120 and the source and drain electrodes 133 and 136, a dry etching step for removing the ohmic contact layer corresponding to a channel region CH of the oxide semiconductor layer 120 is omitted. As a result, deterioration of a top surface of the oxide semiconductor layer 120 due to the dry etching step is prevented and degradation in property of the TFT Tr due to the deterioration of the oxide semiconductor layer 120 is prevented.

In addition, since decomposition and dehydration in the gate insulating layer 110 of the double-layered structure are sufficiently performed due to the second insulator 115 through a hardening step at a temperature of about 350° C. the solvent in the gate insulating layer 110 is largely removed. As a result, the gate insulating layer 110 has a relatively high density, and localized defects and mobile charges hardly exist in the gate insulating layer 110. Accordingly, the interface property between the oxide semiconductor layer 120 of an oxide semiconductor material and the gate insulating layer 110 of the double-layer structure is improved, and the electrical properties of the TFT Tr such as a current-voltage property and a switching property are improved relative to a single-layer structure, making the TFT Tr and array substrate commercially useful.

FIGS. 3A to 3K are cross-sectional views showing a method of fabricating an array substrate including a thin film transistor according to a first embodiment of the present invention.

Figure 3A:
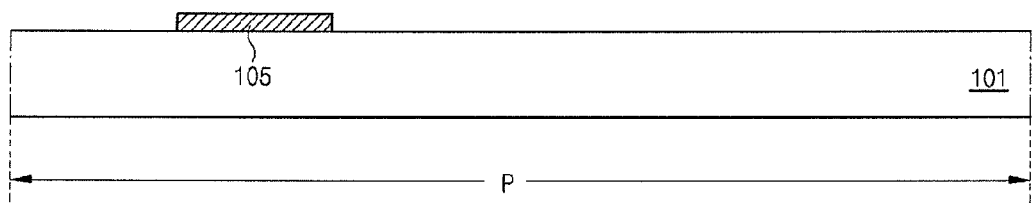
FIGS. 3A to 3K are cross-sectional views showing a method of fabricating an array substrate including a thin film transistor according to a first embodiment of the present invention.

In FIG. 3A, a first metal layer (not shown) is formed on a substrate 101. The substrate 101 may be formed of a transparent material such as glass or plastic. The first metal layer may have a single-layered structure or a double-layered structure by depositing at least one of copper (Cu), copper (Cu) alloy, aluminum (Al), aluminum (Al) alloy such as aluminum neodymium (AlNd), molybdenum (Mo) and molybdenum (Mo) alloy. Next, a gate line (not shown) at a boundary of a pixel region P and a gate electrode 105 connected to the gate line are formed by patterning the first metal layer through a mask process including a coating step of a photoresist, an exposing step using a photo mask, a developing step of the exposed photoresist and an etching step of the first metal layer. The gate electrode 105 of FIG. 3A has an exemplary single-layered structure.

Figure 3B:
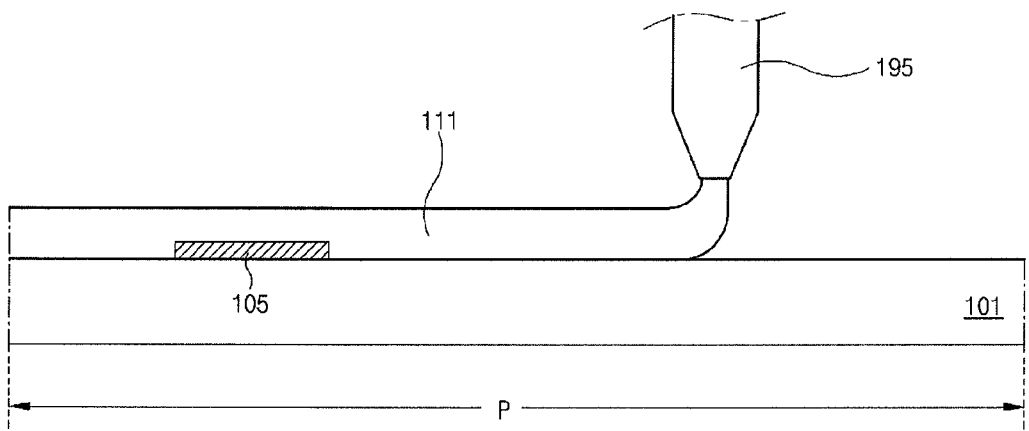

In FIG. 3B, a first insulating material layer 111 is formed on an entire surface of the substrate 101 having the gate line and the gate electrode 105 by coating a first insulating material. For example, the first insulating material may be a solution including an aluminum (Al) oxide material and a first solvent, and the first insulating material may be coated in a normal atmospheric ambient at room temperature, i.e., about 24° C. using a first coating apparatus 195 such as a spin coating apparatus, a slot coating apparatus, an inkjet printing apparatus and a mist coating apparatus. The aluminum oxide material may include a phosphate ($PO_4^{3-}$) to be expressed as $Al_2(PO_4)_{2-x}O_{3x/2}$ ($0 \leq x \leq 1.5$).

Figure 3C:
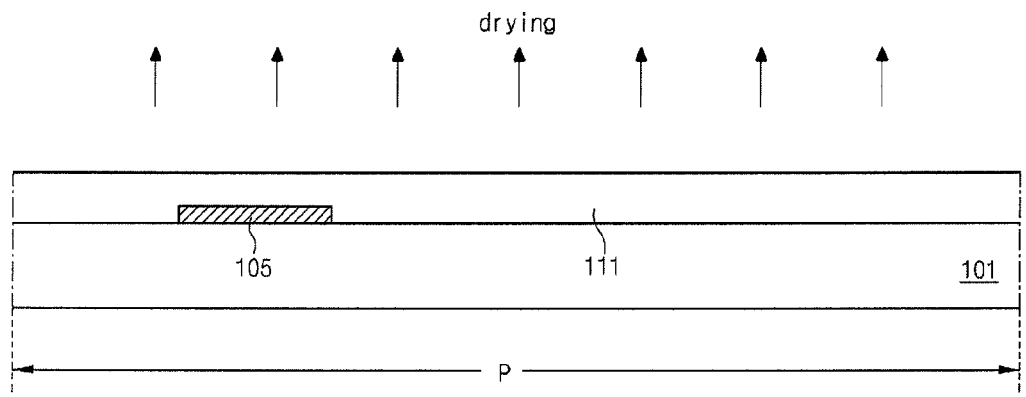

In FIG. 3C, a first drying step is performed for the substrate 101 having the first insulating material layer 111 in a first drying apparatus (not shown). For example, the substrate 101 having the first insulating material layer 111 may be disposed on a hot plate, which has a surface temperature within a range of about 240° C. to about 300° C., for several tens of seconds to several hundreds of seconds, preferably, for about 30 seconds to about 500 seconds such that the first solvent of the first insulating material layer 111 is partially removed into the atmosphere and the first insulating material layer 111 is dried.

Figure 3D:
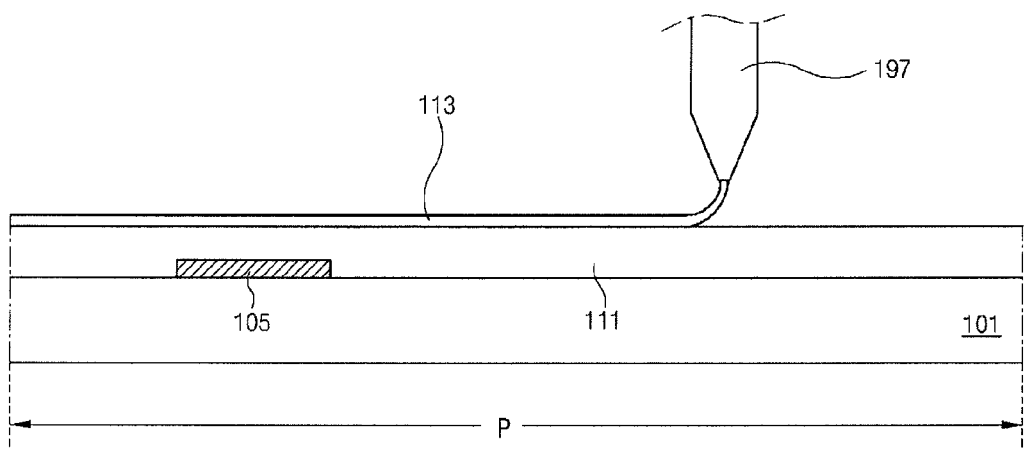

In FIG. 3D, a second insulating material layer 113 is formed on the first insulating material layer 111 by coating a second insulating material. For example, the second insulating material may be a solution including a hafnium (Hf) oxide material and a second solvent, and the second insulating material may be coated in a normal atmospheric ambient at a room temperature, i.e., about 24° C. using a second coating apparatus 197 such as a spin coating apparatus, a slot coating apparatus, an inkjet printing apparatus and a mist coating apparatus. The hafnium oxide material may include a sulfate ($SO_4^{2-}$) to be expressed as $HfO_{2-x}(SO_4)_x$ ($0.2 \leq x \leq 1$).

Figure 3E:
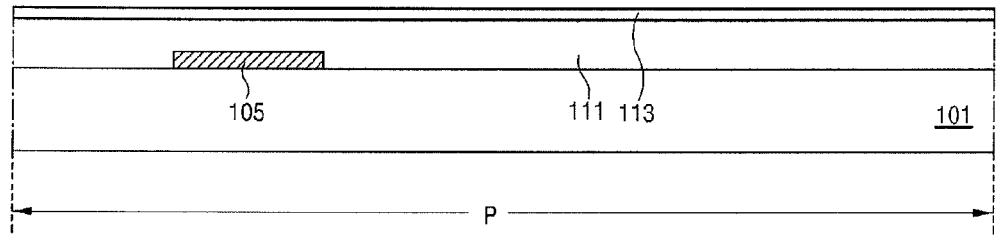

In FIG. 3E, a second drying step is performed for the substrate 101 having the second insulating material layer 113 in a second drying apparatus (not shown). For example, the substrate 101 having the second insulating material layer 113 may be disposed on a hot plate, which has a surface temperature within a range of about 240° C. to about 300° C. for several tens of seconds to several hundreds of seconds, preferably, for about 30 seconds to about 500 seconds such that the second solvent of the second insulating material layer 113 is partially removed into the atmosphere and the second insulating material layer 113 is dried.

Figure 3F:
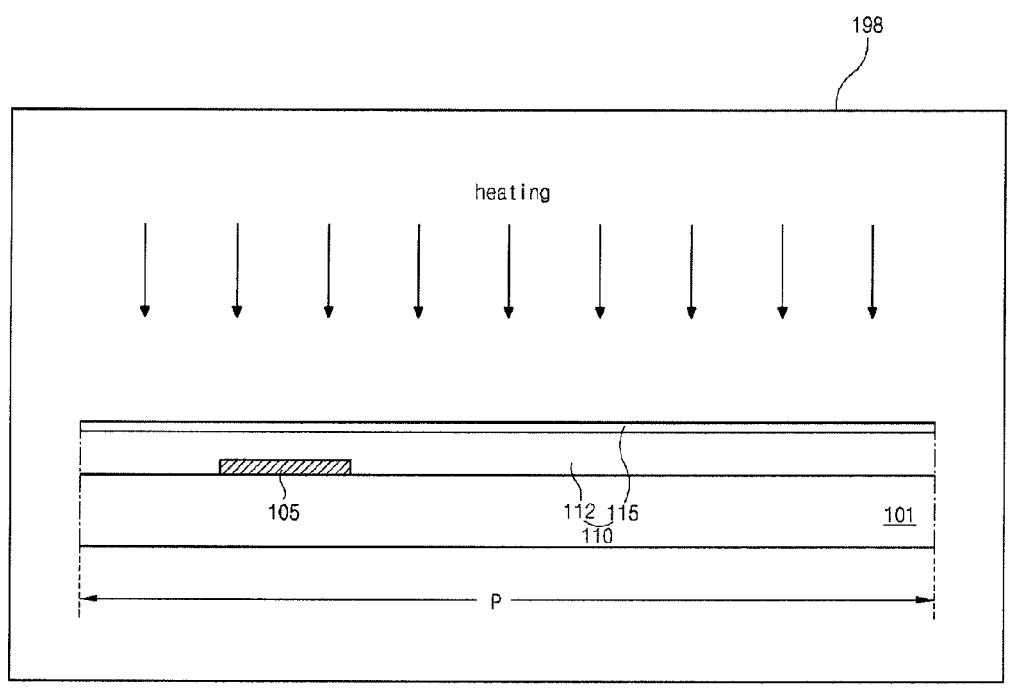

In FIG. 3F, a first hardening step is performed for the substrate 101 having the second insulating material layer 113 (of FIG. 3E) and the first insulating material layer 111 (of FIG. 3E) in a first hardening apparatus (not shown). For example, the substrate 101 having the second insulating material layer 113 and the first insulating material layer 111 may be disposed in a furnace or an oven, which has an inner temperature within a range of about 300° C. to about 350° C.

for several minutes to a hundred and several tens of minutes, preferably, for about 5 minutes to about 120 minutes such that the second solvent of the second insulating material layer 113 and the first solvent of the first insulating material layer 111 are nearly completely removed. For example, about 99 wt % of the first and second solvents in the first and second insulating material layers 111 and 113 may be removed through the hardening step.

Through the first hardening step, the first insulating material layer 111 becomes a first insulator 112 having a thickness within a range of about 100 nm to about 400 nm and the second insulating material layer 113 becomes a second insulator 115 having a thickness of about 10 nm to about 70 nm. The first and second insulators 112 and 115 constitute a gate insulating layer 110.

Since decomposition and dehydration in the first insulating material layer 111 are maximized due to an inner reaction at the interface between the first and second insulating material layers 111 and 113 during the hardening step, the first solvent in the first insulating material layer 111 that may include the aluminum (Al) oxide material is nearly completely removed at a lower temperature for a shorter time period as compared with the gate insulating layer of the soluble aluminum oxide according to the related art.

As a result, the second insulating material layer 113 including the hafnium (Hf) oxide material accelerates decomposition and dehydration in the first insulating material layer 111 including the aluminum (Al) oxide material. In addition, the aluminum (Al) oxide material of the first insulating material layer 111 is diffused into the second insulating material layer 113 and the hafnium (Hf) oxide material of the second insulating material layer 113 is diffused into the first insulating material layer 111 during the hardening step at a temperature within a range of about 300° C. to about 350° C. Accordingly, a density of the gate insulating layer 110 increases and an interface characteristic of the gate insulating layer 110 with an oxide semiconductor layer 120 formed in a subsequent process is improved.

The gate insulating layer 110 having a double-layered structure of the first and second insulators 112 and 115 may have a capacitance density within a range of about 10 nF/cm$^2$ to about 30 nF/cm$^2$.

According to experimental results, the amount of the first and second solvents in the gate insulating layer 110 of a double-layered structure including the aluminum (Al) oxide material and the hafnium (Hf) oxide material through a hardening step at a temperature below about 350° C. for about 60 minutes was substantially the same as the amount of a solvent in a gate insulating layer (a comparison example) of a single-layered structure including aluminum (Al) oxide material through a hardening step at a temperature of about 600° C. for about 60 minutes.

When a gate insulating layer was formed of a soluble insulating material, an interface characteristic of the gate insulating layer with an oxide semiconductor layer was improved as the amount of the solvent removed from the gate insulating layer increases. Further, as the amount of the solvent removed from the gate insulating layer increased, the density of the gate insulating layer increased, and the switching property and the current-voltage property of a thin film transistor including the gate insulating layer was improved.

As a larger amount of the solvent remain in the gate insulating layer, the gate insulating layer has a lower density. As a result, localized defects in the gate insulating layer increase. Further, since mobile charges in the gate insulating layer increase, the switching property and the current-voltage property of the thin film transistor are deteriorated and the reliability of the thin film transistor is reduced.

In the array substrate according to the first embodiment of the present invention, since the second insulating material layer 113 including a hafnium (Hf) oxide material is formed on the first insulating material layer 111 including an aluminum (Al) oxide material and functions as a dehydration accelerator for a solvent, the dehydration rate of the first and second insulating material layers 111 and 113 during the hardening step is improved. As a result, the first and second solvents in the first and second insulating material layers 111 and 113 are nearly completely removed through the hardening step of a relatively low temperature and a relatively short time period and the gate insulating layer 110 of the double-layered structure having a relatively dense inner structure is obtained.

Figure 3G:
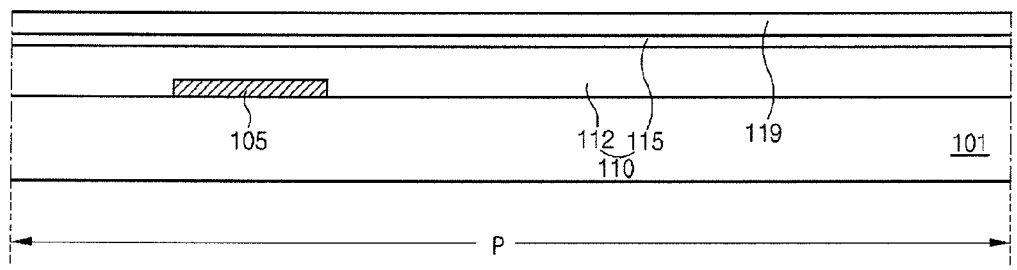

In FIG. 3G, an oxide semiconductor material layer (not shown) is formed on the gate insulating layer 110 by coating a soluble oxide semiconductor material. For example, the soluble oxide semiconductor material may be a solution including a third solvent and a zinc oxide (ZnO) material such as indium gallium zinc oxide (IGZO), zinc tin oxide (ZTO) and zinc indium oxide (ZIO) and the soluble oxide semiconductor material may be coated using a third coating apparatus (not shown) such as a spin coating apparatus, a slot coating apparatus, an inkjet printing apparatus and a mist coating apparatus.

Next, the substrate 101 having the oxide semiconductor material layer may be disposed on a third drying apparatus such as a hot plate, which has a surface temperature within a range of about 240° C. to about 300° C., for several tens of seconds to several hundreds of seconds, preferably, for about 30 seconds to about 500 seconds such that the third solvent of the oxide semiconductor material layer is partially removed and the oxide semiconductor material layer is dried.

Next, a second hardening step is performed for the substrate 101 having the dried oxide semiconductor material layer in a second hardening apparatus (not shown). For example, the substrate 101 having the dried oxide semiconductor material layer may be disposed in a furnace or an oven, which has an inner temperature within a range of about 300° C. to about 350° C., for several minutes to a hundred and several tens of minutes, preferably, for about 5 minutes to about 120 minutes such that the third solvent of the oxide semiconductor material layer are nearly completely removed. For example, about 99 wt % of the third solvent in the oxide semiconductor material layer may be removed through the second hardening step. Through the second hardening step, the oxide semiconductor material layer becomes a cured oxide semiconductor material layer 119.

Figure 3H:
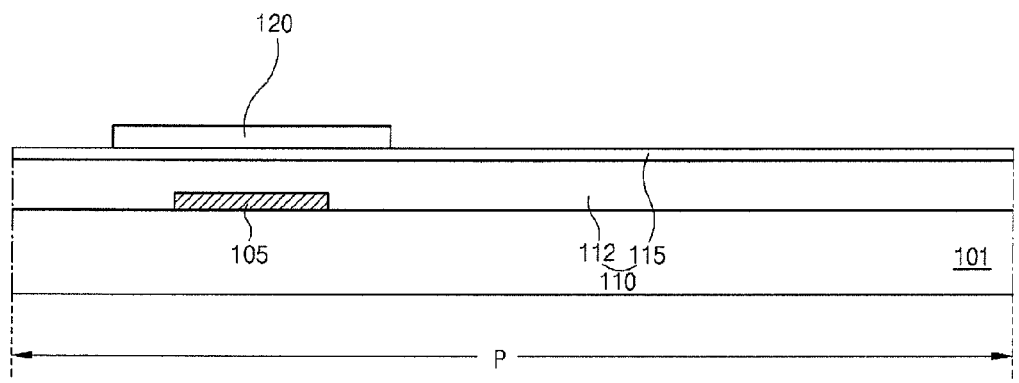

In FIG. 3H, an oxide semiconductor layer 120 having an island shape is formed by patterning the cured oxide semiconductor material layer 119 (of FIG. 3G) through a mask process. The oxide semiconductor layer 120 is disposed to overlap the gate electrode 105.

Figure 3I:
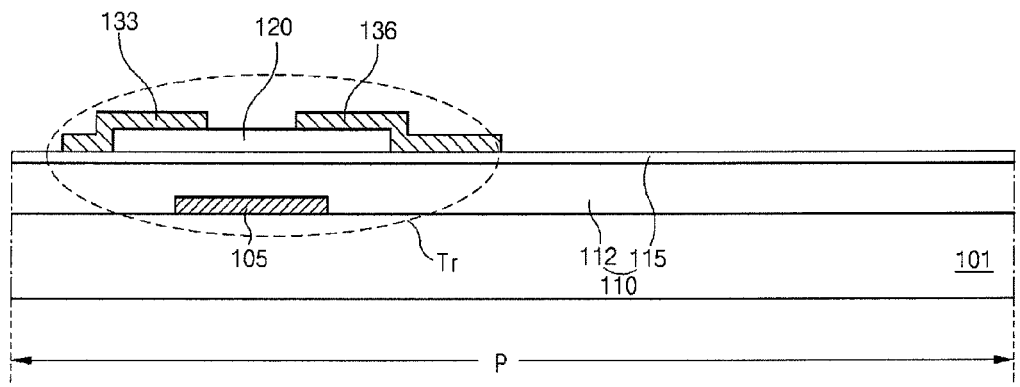

In FIG. 3I, a second metal layer (not shown) is formed on the oxide semiconductor layer 120. The second metal layer may have a single-layered structure or a double-layered structure by depositing at least one of aluminum (Al), aluminum (Al) alloy such as aluminum neodymium (AlNd), copper (Cu), copper alloy (Cu), chromium (Cr), molybdenum (Mo) and molybdenum alloy such as molybdenum titanium (MoTi). Next, after a photoresist layer is formed on the second metal layer by coating a photoresist and the photoresist layer is exposed through a photo mask, a photoresist pattern is formed on the second metal layer by developing the exposed photoresist layer. Next, a data line (not shown), a source electrode 133 and a drain electrode 136 are formed by etching the second metal layer using the photoresist pattern as an etching mask. The data line on the gate insulating layer 110 crosses the gate line to define the pixel region P, and the source and drain electrodes 133 and 136 on the oxide semiconductor layer 120 are spaced apart from each other. In addition the source electrode 133 is connected to the data line. Each of the data line, the source electrode 133 and the drain electrode 136 has an exemplary single-layered structure in FIG. 3I.

The gate electrode 105, the gate insulating layer 110 of a double-layered structure, the oxide semiconductor layer 120, the source electrode 133, and the drain electrode 136 constitute a thin film transistor (TFT) Tr. Since the oxide semiconductor layer 120 intrinsically has an ohmic contact property with a metallic material for the second metal layer, an ohmic contact layer including impurity-doped silicon is not required to the oxide semiconductor layer 120. As a result, the oxide semiconductor layer 120 has a single-layered structure instead of a double-layered structure for a semiconductor layer including an active layer of intrinsic silicon and an ohmic contact layer of impurity-doped silicon. In addition, an additional etching step for removing the ohmic contact layer exposed between the source and drain electrodes 133 and 136 is not required even after the source and drain electrodes 133 and 136 are formed. Accordingly, damages of a top surface of the oxide semiconductor layer 120 due to the additional etching step are not generated and deterioration in characteristics of the TFT Tr is prevented.

Further, an interface property between the oxide semiconductor layer 120 of an oxide semiconductor material and the gate insulating layer 110 of the double-layered structure is improved, and decomposition and dehydration in the gate insulating layer 110 of the double-layered structure are sufficiently performed. As a result, the electrical property of the TFT Tr such as a current-voltage property, switching property, and the reliability of the TFT Tr are improved.

After the data line, the source electrode 133 and the drain electrode 136 are formed, the photoresist pattern is removed through a stripping step and the data line, the source electrode 133 and the drain electrode 136 are exposed.

Figure 3J:
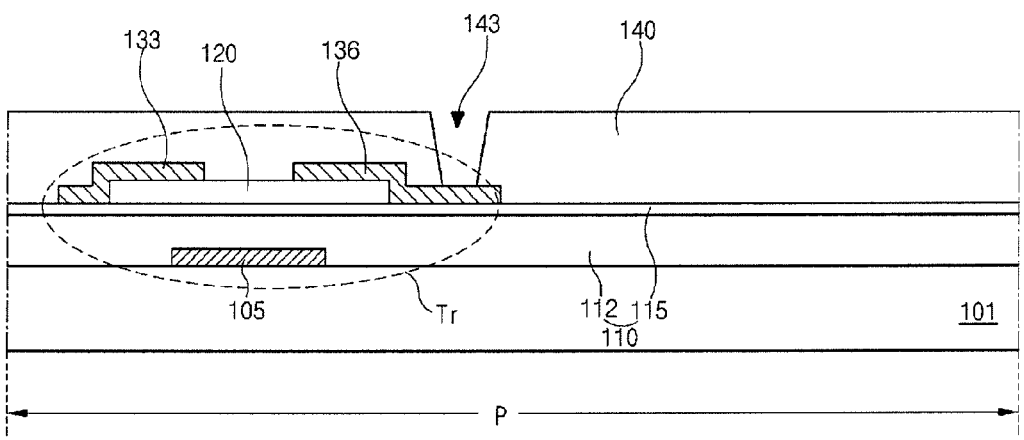

In FIG. 3J, a passivation layer 140 is formed on the data line, the source electrode 133 and the drain electrode 136 by coating an organic insulating material such as benzocyclobutene (BCB) and photo acryl using a coating apparatus or by depositing an inorganic insulating material such as silicon oxide ($SiO_2$) and silicon nitride (SiNx). For example, the passivation layer 140 of an organic insulating material may have a flat top surface. Next, a drain contact hole 143 exposing the drain electrode 136 is formed in the passivation layer 140 through a mask process.

Figure 3K:
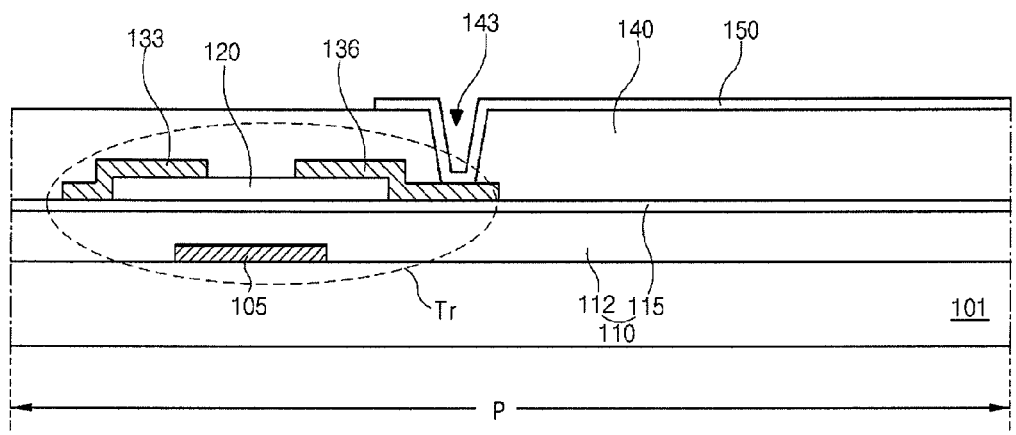

In FIG. 3K, a pixel electrode 150 is formed in the pixel region P on the passivation layer 140 by depositing and patterning a transparent conductive material such as indium-tin-oxide (ITO) and indium-zinc-oxide (IZO) through a mask process. The pixel electrode 150 is connected to the drain electrode 136 through the drain contact hole 143.

FIGS. 4A to 4F are cross-sectional views showing a method of fabricating an array substrate including a thin film transistor according to a second embodiment of the present invention.

Figure 4A:
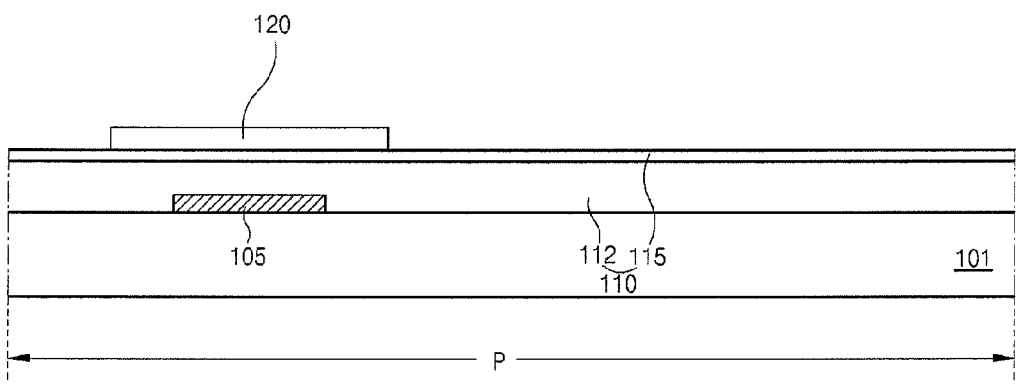
FIGS. 4A to 4F are cross-sectional views showing a method of fabricating an array substrate including a thin film transistor according to a second embodiment of the present invention.

In FIG. 4A, a gate line (not shown) at a boundary of a pixel region P and a gate electrode 105 connected to the gate line are formed on a substrate 101 and a gate insulating layer 110 is formed on the gate line and the gate electrode 105. The gate insulating layer has a double-layered structure including a first insulator 112 of aluminum (Al) oxide and a second insulator 115 of hafnium (Hf) oxide.

Next, an oxide semiconductor material layer (not shown) is formed on the gate insulating layer 110 by coating a soluble oxide semiconductor material. For example, the soluble oxide semiconductor material may include a zinc oxide (ZnO) material such as indium gallium zinc oxide (IGZO), zinc tin oxide (ZTO) and zinc indium oxide (ZIO) and the soluble oxide semiconductor material may be coated using a coating apparatus (not shown) such as a spin coating apparatus, a slot coating apparatus, an inkjet printing apparatus and a mist coating apparatus.

Next, a drying step is performed for the substrate 101 having the oxide semiconductor material layer in a drying apparatus (not shown). For example, the substrate 101 having the oxide semiconductor material layer may be disposed on a hot plate, which has a surface temperature within a range of about 240° C. to about 300° C., for several tens of seconds to several hundreds of seconds, preferably, for about 30 seconds to about 500 seconds such that a solvent of the oxide semiconductor material layer is removed and the oxide semiconductor material layer is dried.

Next, a hardening step is performed for the substrate 101 having the dried oxide semiconductor material layer in a hardening apparatus (not shown). For example, the substrate 101 having the dried oxide semiconductor material layer may be disposed in a furnace or an oven, which has an inner temperature within a range of about 300° C. to about 350° C., for several minutes to a hundred and several tens minutes, preferably, for about 5 minutes to about 120 minutes such that the solvent of the oxide semiconductor material layer are nearly completely removed. For example, about 99 wt % of the solvent in the oxide semiconductor material layer may be removed through the second hardening step. Through the hardening step, the oxide semiconductor material layer becomes a cured oxide semiconductor material layer (not shown).

Next, an oxide semiconductor layer 120 having an island shape is formed by patterning the cured oxide semiconductor material layer through a mask process. The oxide semiconductor layer 120 is disposed to overlap the gate electrode 105.

Figure 4B:
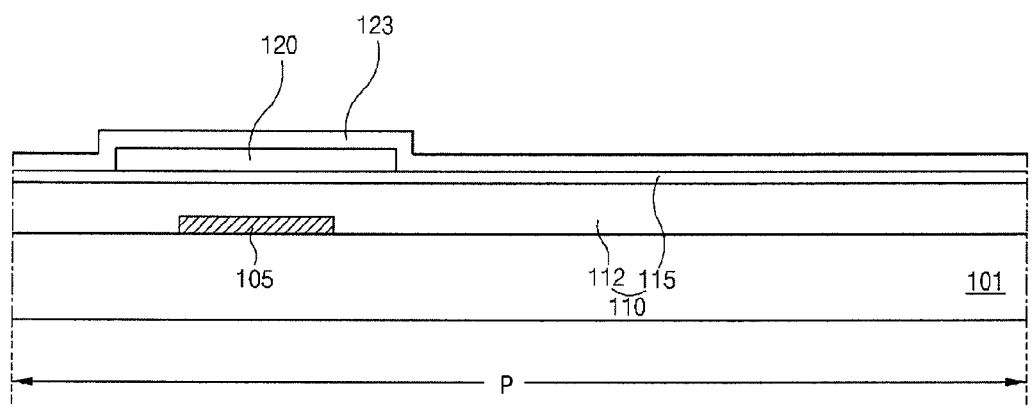

In FIG. 4B, a buffer layer 123 is formed on the oxide semiconductor layer 120 by coating an organic insulating material such as benzocyclobutene (BCB) and photo acryl or by depositing an inorganic insulating material such as silicon oxide ($SiO_2$) and silicon nitride (SiNx).

Figure 4C:
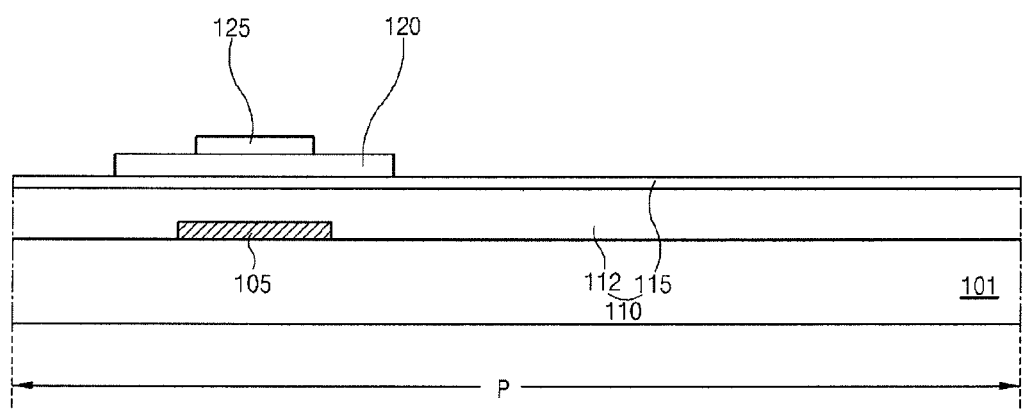

In FIG. 4C, an etch stopper 125 having an island shape is formed on the oxide semiconductor layer 120 by patterning the buffer layer 123 (of FIG. 4B). The etch stopper 125 may be disposed at a central portion of the oxide semiconductor layer to overlap the gate electrode 105.

Figure 4D:
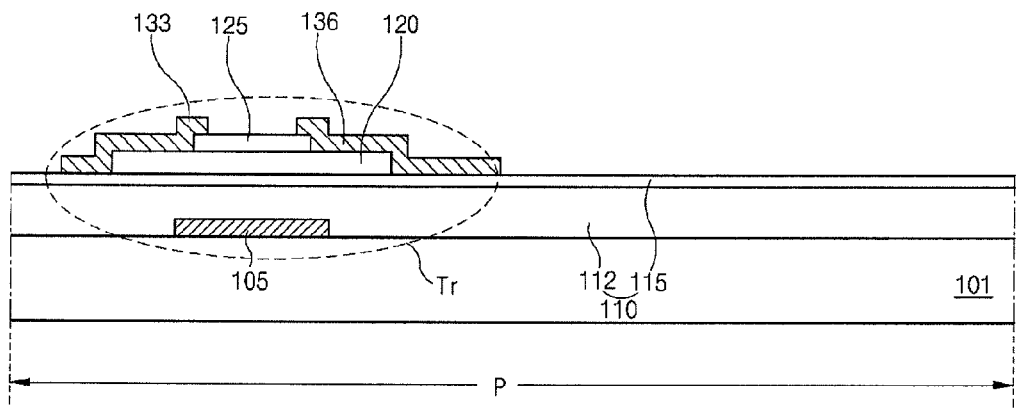

In FIG. 4D, source and drain electrodes 133 and 136 are formed on the etch stopper 125. The source and drain electrodes 133 and 136 are spaced apart from each other and each of the source and drain electrodes 133 and 136 contacts the oxide semiconductor layer 120 and the etch stopper 125. In addition, a data line (not shown) connected to the source electrode 133 is formed together with the source and drain electrodes 133 and 136. The gate electrode 105, the gate insulating layer 110 of a double-layered structure, the oxide semiconductor layer 120, the source electrode 133 and the drain electrode 136 constitute a thin film transistor (TFT) Tr.

Figure 4E:
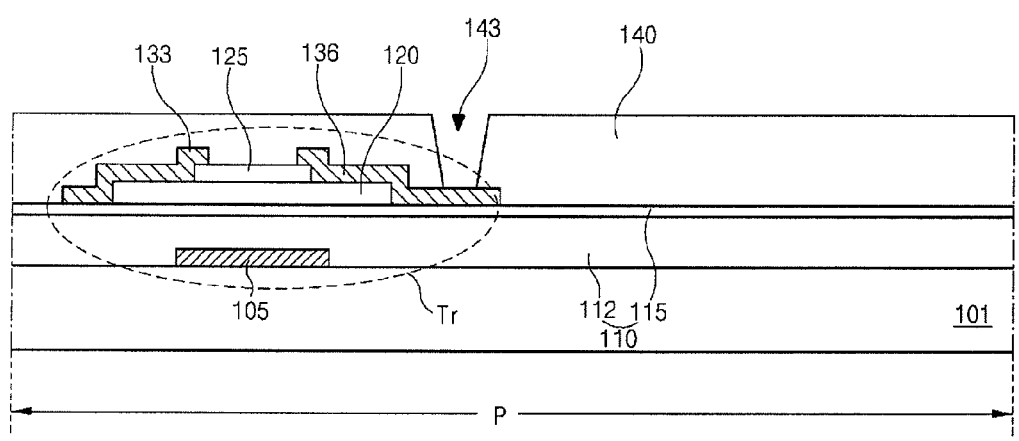

In FIG. 4E, a passivation layer 140 having a drain contact hole 143 is formed on the data line, the source electrode 133 and the drain electrode 136. The drain contact hole 143 exposes the drain electrode 136.

Figure 4F:
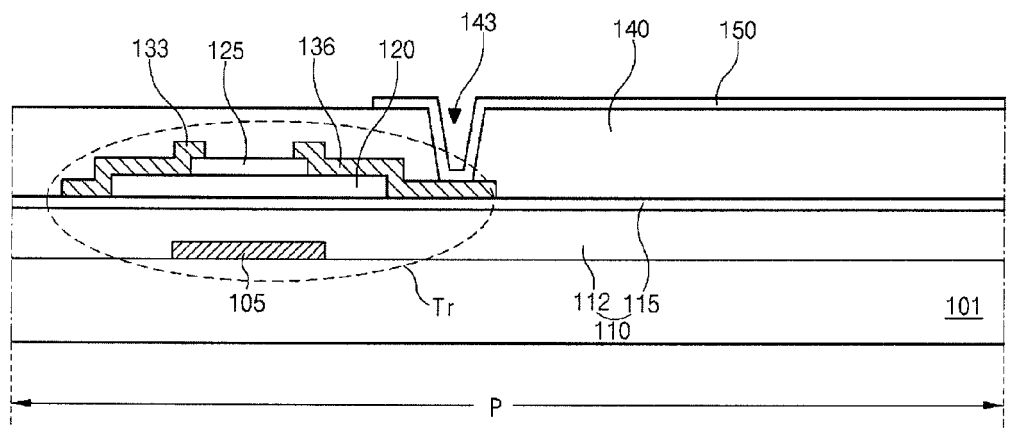

In FIG. 4F, a pixel electrode 150 is formed in the pixel region P on the passivation layer 140. The pixel electrode 150 is connected to the drain electrode 136 through the drain contact hole 143.

In the array substrate according to the second embodiment of the present invention, since the etch stopper 125 is formed on the oxide semiconductor layer 120, the oxide semiconductor layer 120 is not exposed to an etching solution used in the step of forming the source and drain electrodes 133 and 136. Accordingly, damages of a top surface of the oxide semiconductor layer 120 corresponding to a channel region of the TFT Tr due to the etching solution are prevented.

FIGS. 5A to 5E are cross-sectional views showing a method of fabricating an array substrate including a thin film transistor according to a third embodiment of the present invention. Since the method of fabricating the array substrate according to the third embodiment is the same as the method of fabricating the array substrate according to the second embodiment except for steps of forming an oxide semiconductor layer and an etch stopper, FIGS. 5A to 5E just show the steps of forming the oxide semiconductor layer and the etch stopper.

Figure 5A:
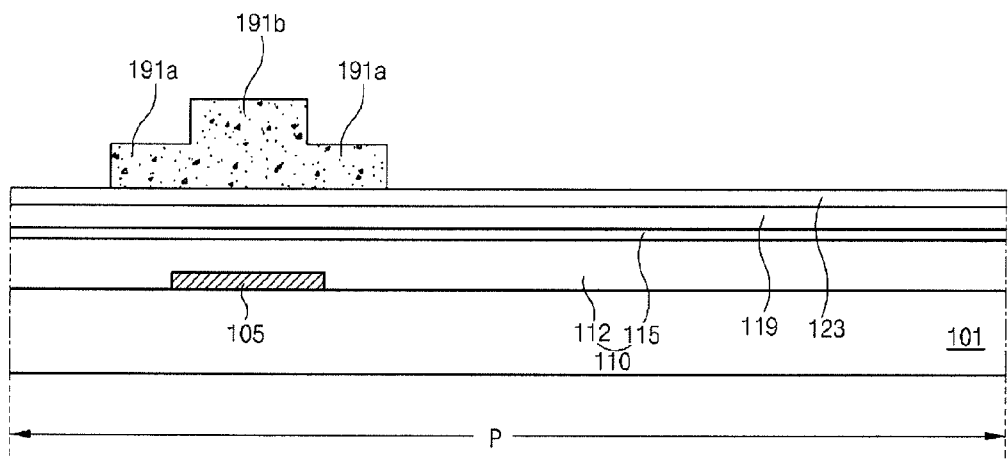
FIGS. 5A to 5E are cross-sectional views showing a method of fabricating an array substrate including a thin film transistor according to a third embodiment of the present invention.

In FIG. 5A, an oxide semiconductor material layer 119 and a buffer layer 123 are sequentially formed on a gate insulating layer 110. The oxide semiconductor material layer 119 may include a zinc oxide (ZnO) material such as indium gallium zinc oxide (IGZO), zinc tin oxide (ZTO) and zinc indium oxide (ZIO) through a dry step and a hardening step. The buffer layer 123 may be formed by coating an organic insulating material such as benzocyclobutene (BCB) and photo acryl or by depositing an inorganic insulating material such as silicon oxide ($SiO_2$) and silicon nitride (SiNx).

Next, after a photoresist layer (not shown) is formed on the buffer layer 123, the photoresist layer is exposed and developed to form first and second photoresist patterns 191a and 191b. Here, a photo mask having a transmissive area, a half-transmissive area and a blocking area is used for exposure. A transmittance of the half-transmissive area is greater than a transmittance of the blocking area and is smaller than a transmittance of the transmissive area. For example, the half-transmissive area may include a slit pattern or a halftone pattern. The first photoresist pattern 191a may correspond to the half-transmissive area and may have a first thickness, and the second photoresist pattern 191b may correspond to the blocking area and may have a second thickness greater than the first thickness.

Figure 5B:
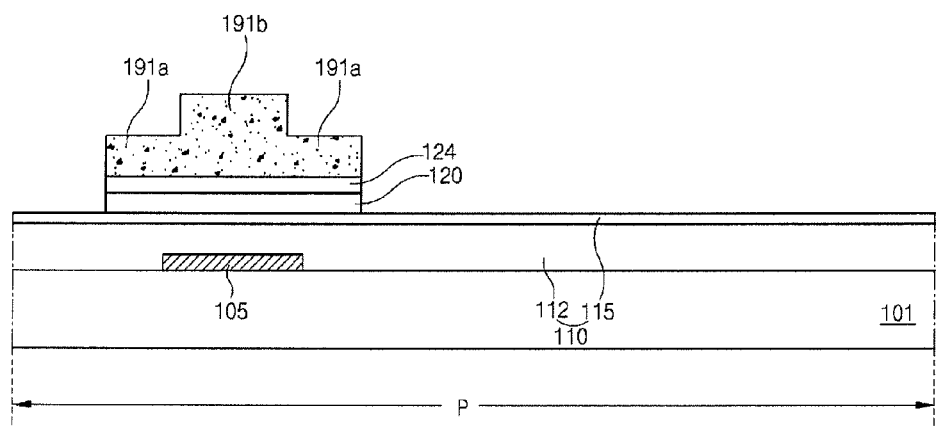

In FIG. 5B, an oxide semiconductor layer 120 and a buffer pattern 124 are formed on the gate insulating layer 110 by sequentially etching the buffer layer 123 (of FIG. 5A) and the oxide semiconductor material layer 119 (of FIG. 5A) exposed outside the first and second photoresist patterns 191a and 191b. The oxide semiconductor layer 120 and the buffer pattern 124 have an island shape and the same size as each other.

Figure 5C:
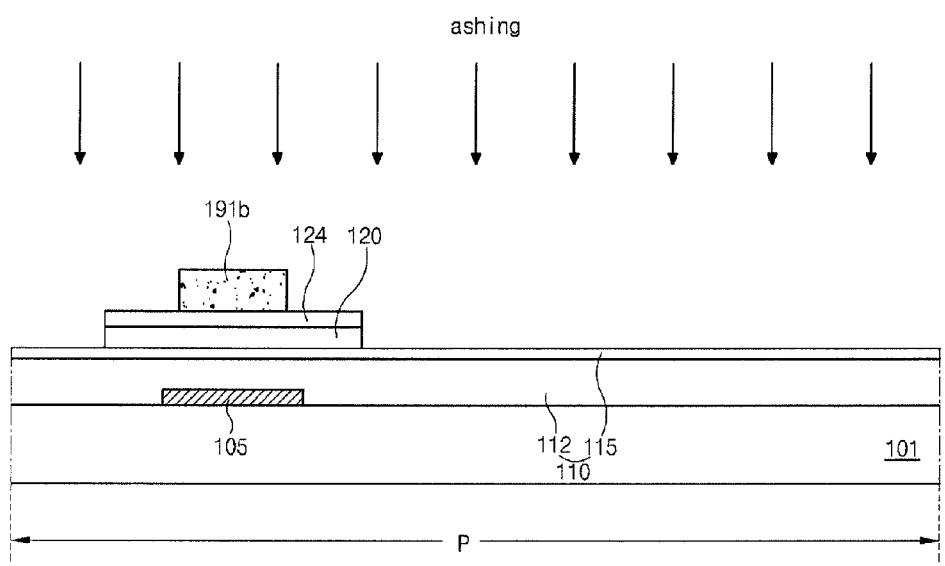

In FIG. 5C, the first photoresist pattern 191a (of FIG. 5B) having the first thickness is removed and the second photoresist pattern 191b having the second thickness are partially removed through an ashing step such that edge portions of the buffer pattern 124 is exposed outside the remaining second photoresist pattern 191b.

Figure 5D:
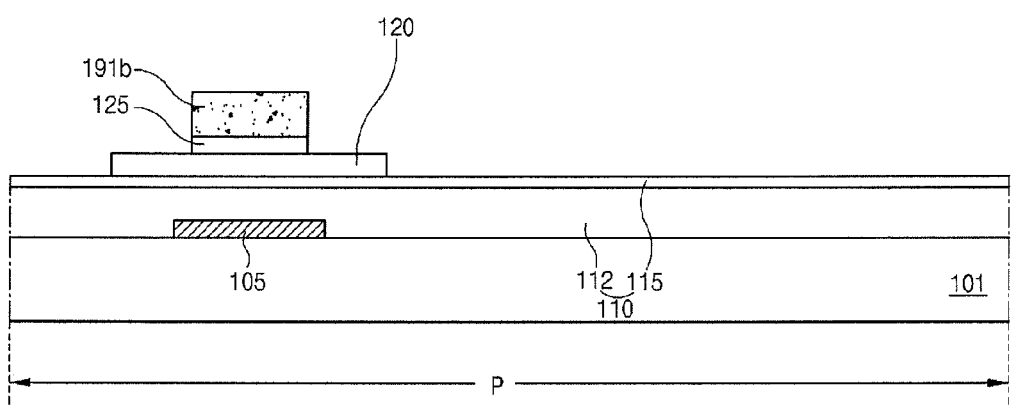

In FIG. 5D, an etch stopper 125 is formed on the semiconductor layer 120 by etching the edge portions of the buffer pattern 124 (of FIG. 5C) exposed outside the remaining second photoresist pattern 191b.

Figure 5E:
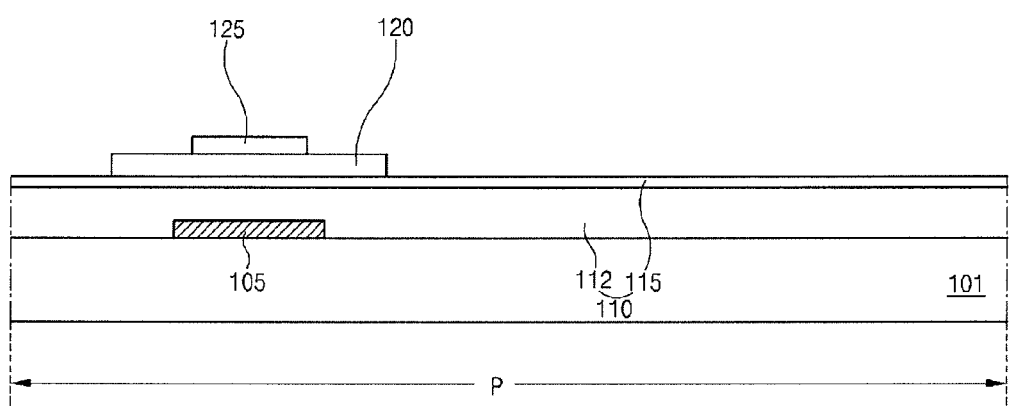

In FIG. 5E, the remaining second photoresist pattern 191b (of FIG. 5D) is removed through a stripping step and the oxide semiconductor layer 120 and the etch stopper 125 are obtained.

The oxide semiconductor layer 120 and the etch stopper 125 are formed using a single mask in the third embodiment, while the oxide semiconductor layer 120 and the etch stopper 125 are formed using two masks in the second embodiment. As a result, the fabrication process according to the third embodiment is simplified as compared with the fabrication process according to the second embodiment.

Figure 6:
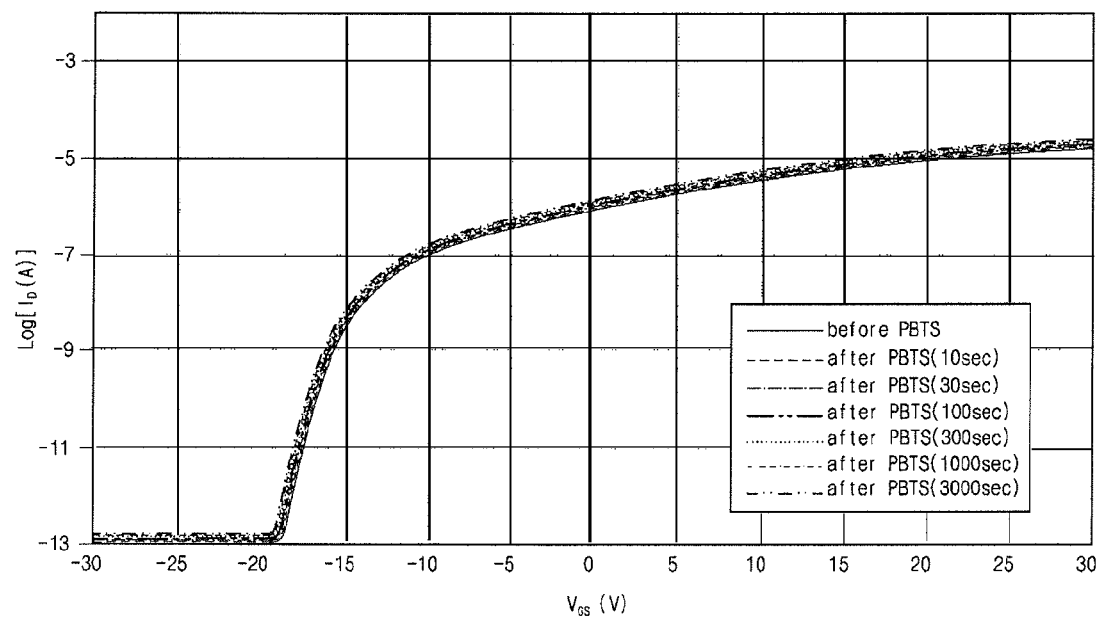
FIG. 6 is a graph showing a current-voltage curve change of a thin film transistor due to a positive bias temperature stress (PBTS) test for an array substrate according to the first and second embodiments of the present invention.
Figure 7:
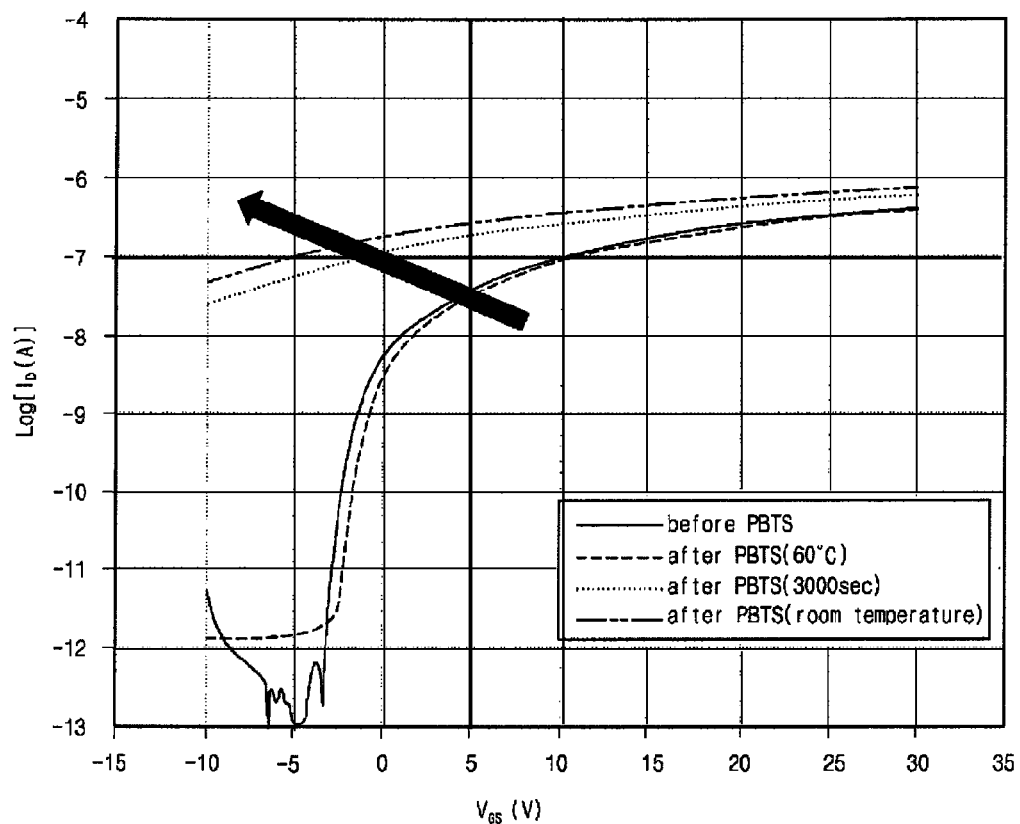
FIG. 7 is a graph showing a current-voltage curve change of a thin film transistor due to a positive bias temperature stress (PBTS) test for an array substrate according to first and second comparison embodiments without thin layer 115.

FIG. 6 is a graph showing a current-voltage curve change of a thin film transistor representative of a positive bias temperature stress (PBTS) test for an array substrate according to the first and second embodiments of the present invention. FIG. 7 is a graph showing a current-voltage curve change of a thin film transistor without thin layer 115 due to a positive bias temperature stress (PBTS) test for an array substrate according to first and second comparison embodiments, respectively. A gate insulating layer of the thin film transistor of FIG. 6 has a double-layered structure and includes a first insulator of an aluminum (Al) oxide material and a second insulator of a hafnium (Hf) oxide material having a thickness of about 10 nm to 70 nm with a hardening step at a temperature of about 350° C. A gate insulating layer of the thin film transistor of FIG. 7 has a single-layered structure and includes an aluminum (Al) oxide material through a hardening step at a temperature about 350° C. The abscissa of FIGS. 6 and 7 represents a voltage between a gate electrode and a source electrode of the thin film transistor, and the ordinate of FIGS. 6 and 7 represents a current between a drain electrode and a source electrode of the thin film transistor.

In FIG. 6, a current-voltage curve of the thin film transistor including the gate insulating layer, which has the first insulator of the aluminum (Al) oxide material and the second insulator of the hafnium (Hf) oxide material having a thickness of about 10 nm to 70 nm, is hardly changed before and after the PBTS test. Since the solvents in the gate insulating layer are nearly completely removed through the hardening step at a temperature of about 350° C. the thin film transistor of FIG. 6 does not have a threshold voltage shift before and after the PBTS test.

In FIG. 7, however, a current-voltage curve of each of the thin film transistor including the gate insulating layer, which has a single-layered structure of the aluminum (Al) oxide material is changed after the PBTS test. Since the solvents in the gate insulating layer are not completely removed through the hardening step at a temperature of about 350° C. the thin film transistor of FIG. 7 has a threshold voltage shift toward a negative voltage direction after the PBTS test.

Figure 8:
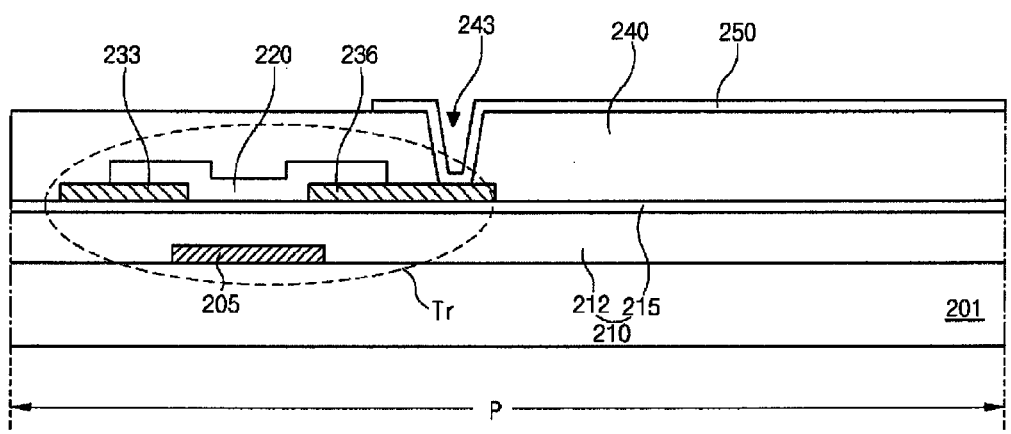
FIG. 8 is a cross-sectional view showing an array substrate including a thin film transistor according to a fourth embodiment of the present invention.

FIG. 8 is a cross-sectional view showing an array substrate including a thin film transistor according to a fourth embodiment of the present invention.

In FIG. 8, a gate line (not shown) and a gate electrode 205 connected to the gate line are formed on a substrate 201 such as a glass substrate and a plastic substrate. The gate line may be disposed at a boundary of a pixel region P and the gate electrode 205 may be disposed in the pixel region P.

In addition, a gate insulating layer 210 is formed on the gate line and the gate electrode 205. The gate insulating layer 210 may have a capacitance density within a range of about 10 $nF/cm^2$ to about 30 $nF/cm^2$. The gate insulating layer 210 has a double-layered structure including a first insulator 212 and a second insulator 215 on the first insulator 212. The first insulator 212 may include an aluminum oxide material such as $Al_2(PO_4)_{2-x}O_{3x/2}$ ($0 \leq x \leq 1.5$). In addition, the first insulator 212 may have a dielectric constant within a range of about 4 to about 6 and may have a thickness within a range of about 100 nm to about 400 nm. The second insulator 215 may include a hafnium oxide material such as $HfO_{2-x}(SO_4)_x$ ($0.25 \leq x \leq 1$). In addition the second insulator 215 may have a dielectric constant within a range of about 9 to about 12 and may have a thickness within a range of about 10 nm to about 70 nm. Since the second insulator 215 is much thinner as compared with the first insulator 212, a gate insulating layer 210 may have a dielectric constant within a range of about 4 to about 6.

A data line (not shown), a source electrode 233 and a drain electrode 236 are formed on the gate insulating layer 210. The data line may be disposed at the boundary of the pixel region P such that the gate line and the data line cross each other to define the pixel region P. The source and drain electrodes 233 and 236 are spaced apart from each other and the source electrode 233 is connected to the data line.

Further, an oxide semiconductor layer 220 of an island shape is formed on the source and drain electrodes 233 and 236 and on the gate insulating layer 210 over the gate electrode 205. The oxide semiconductor layer 220 may include an oxide semiconductor material such as a zinc oxide (ZnO) material. For example, the zinc oxide material may include at least one of indium gallium zinc oxide (IGZO), zinc tin oxide (ZTO) and zinc indium oxide (ZIO).

The gate electrode 205, the gate insulating layer 210, the source electrode 233, the drain electrode 236 and the oxide semiconductor layer 220 constitute a thin film transistor (TFT) Tr. Since the oxide semiconductor layer 220 is formed on the source and drain electrodes 233 and 236, the TFT Tr has a bottom contact type where a bottom surface of the oxide semiconductor layer 220 contacts top surfaces of the source and drain electrodes 233 and 236.

A passivation layer 240 is formed on the oxide semiconductor layer 220, and a pixel electrode 250 is formed on the passivation layer 240. The passivation layer 240 includes a drain contact hole 243 exposing the drain electrode 236, and the pixel electrode 250 is connected to the drain electrode 236 through the drain contact hole 243.

In the array substrate according to the fourth embodiment of the present invention, since an ohmic contact layer for ohmic contact is not formed between the source and drain electrodes 233 and 236 and the oxide semiconductor layer 220, a dry etching step for removing the ohmic contact layer corresponding to a channel region CH of the oxide semiconductor layer 220 is omitted. As a result, a fabrication process for the array substrate is simplified.

In addition, since decomposition and dehydration in the gate insulating layer 210 of the double-layered structure are sufficiently performed due to the second insulator 215 through a hardening step of a temperature of about 350° C. a solvent in the gate insulating layer 210 is nearly completely removed. As a result, the gate insulating layer 210 has a relatively high density, localized defects, and mobile charges hardly exist in the gate insulating layer 210. Accordingly, the interface property between the oxide semiconductor layer 220 of an oxide semiconductor material and the gate insulating layer 210 of the double-layered structure is improved, and the electrical properties of the TFT Tr such as a current-voltage property and a switching property are improved.

The method of fabricating an array substrate according to the fourth embodiment is the same as the method of fabricating an array substrate according to the first embodiment except the sequence of the step of forming the source and drain electrodes 233 and 236 and the step of forming the oxide semiconductor layer 220.

Consequently, in an array substrate according to the present invention, since the solvents in the gate insulating layer are nearly completely removed due to the second insulator even through the hardening step at a temperature of about 350° C. the gate insulating layer has a relatively high density. In addition, since the interface property between the gate insulating layer and the oxide semiconductor layer is improved, the thin film transistor has an excellent electrical property such as a current-voltage property. Further, since the thin film transistor does not have a threshold voltage shift toward a negative voltage direction after the positive bias temperature stress (PBTS) test and a threshold voltage shift toward a positive voltage direction after the negative bias temperature stress (NBTS) test. As a result, the reliability of the array substrate is improved.

In addition, since all fabrication steps are performed at a temperature lower than about 350° C., deterioration of the thin film transistor including the semiconductor material is prevented and lifetime of the thin film transistor is extended. Furthermore, the array substrate is applicable to a flexible display device by using a plastic substrate as a base substrate.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate, comprising:
  a substrate;
  a gate electrode on the substrate;
  a gate insulating layer on the gate electrode, the gate insulating layer including a first insulator and a second insulator on the first insulator, wherein the first insulator includes an aluminum oxide material and has a first thickness, and the second insulator includes a hafnium oxide material and has a second thickness;
  an oxide semiconductor layer on the gate insulating layer over the gate electrode;
  a source electrode and a drain electrode contacting the oxide semiconductor layer, the source electrode and the drain electrode spaced apart from each other;
  a passivation layer on the source electrode and the drain electrode, the passivation layer having a drain contact hole exposing the drain electrode; and
  a pixel electrode on the passivation layer, the pixel electrode connected to the drain electrode through the drain contact hole,
  wherein the aluminum oxide material includes a phosphate ($PO_4^{3-}$) to be expressed as $Al_2(PO_4)_{2-x}O_{3x/2}$ ($0 \leq x \leq 1.5$).

2. The array substrate according to claim 1, wherein the source and drain electrodes are formed on the oxide semiconductor layer such that a top surface of the oxide semiconductor layer contacts bottom surfaces of the source and drain electrodes.

3. The array substrate according to claim 2, further comprising an etch stopper formed on the oxide semiconductor layer and formed between the source and drain electrodes, the etch stopper including an insulating material and disposed on a central portion of the oxide semiconductor layer.

4. The array substrate according to claim 1, wherein the oxide semiconductor layer is formed on the source and drain electrodes such that a bottom surface of the oxide semiconductor layer contacts top surfaces of the source and drain electrodes.

5. The array substrate according to claim 1, wherein the gate insulating layer has a capacitance density within a range of about 10 nF/cm$^2$ to about 30 nF/cm$^2$, the first insulator has a dielectric constant within a range of about 4 to about 6, and the second insulator has a dielectric constant within a range of about 9 to about 12.

6. The array substrate according to claim 1, wherein the hafnium oxide material includes a sulfate ($SO_4^{2-}$) to be expressed as $HfO_{2-x}(SO_4)_x (0.2 \leq x \leq 1)$.

7. The array substrate according to claim 1, wherein the first thickness is within a range of about 100 nm to about 400 nm, and the second thickness is within a range of about 10 nm to about 70 nm.

8. The array substrate according to claim 1, wherein the oxide semiconductor layer includes a zinc oxide material.

9. The array substrate according to claim 8, wherein the zinc oxide material includes at least one of indium gallium zinc oxide (IGZO), zinc tin oxide (ZTO) and zinc indium oxide (ZIO).

10. A method of fabricating an array substrate, comprising:
    forming a gate electrode on a substrate;
    forming a gate insulating layer on the gate electrode, the gate insulating layer including a first insulator and a second insulator on the first insulator, wherein the first insulator includes an aluminum oxide material and has a first thickness, and the second insulator includes a hafnium oxide material and has a second thickness;
    forming an oxide semiconductor layer on the gate insulating layer over the gate electrode;
    forming a source electrode and a drain electrode over the gate insulating layer, the source electrode and the drain electrode contacting the oxide semiconductor layer and spaced apart from each other;
    forming a passivation layer on the source electrode and the drain electrode, the passivation layer having a drain contact hole exposing the drain electrode; and
    forming a pixel electrode on the passivation layer, the pixel electrode connected to the drain electrode through the drain contact hole,
    wherein the aluminum oxide material includes a phosphate ($PO_4^{3-}$) to be expressed as $Al_2(PO_4)_{2-x}O_{3x/2} (0 \leq x \leq 1.5)$.

11. The method according to claim 10, wherein the source and drain electrodes are formed on the oxide semiconductor layer such that a top surface of the oxide semiconductor layer contacts bottom surfaces of the source and drain electrodes.

12. The method according to claim 11, further comprising forming an etch stopper formed on the oxide semiconductor layer and formed between the source and drain electrodes, the etch stopper including an insulating material and disposed on a central portion of the oxide semiconductor layer.

13. The method according to claim 10, wherein the oxide semiconductor layer is formed on the source and drain electrodes such that a bottom surface of the oxide semiconductor layer contacts top surfaces of the source and drain electrodes.

14. The method according to claim 10, wherein the hafnium oxide material includes a sulfate ($SO_4^{2-}$) to be expressed as $HfO_{2-x}(SO_4)_x (0.2 \leq x \leq 1)$.

15. The method according to claim 10, wherein the first thickness is within a range of about 100 nm to about 400nm, and the second thickness is within a range of about 10 nm to about 70 nm.

16. The method according to claim 10, wherein forming the gate insulating layer comprises:
    forming an aluminum oxide material layer on the gate electrode by coating a first solution including the aluminum oxide material and a first solvent;
    forming a hafnium oxide material layer on the aluminum oxide material layer by coating a second solution including the hafnium oxide material and a second solvent; and
    removing the first and second solvents from the aluminum oxide material layer and the hafnium oxide material layer by disposing the substrate having the aluminum oxide material layer and the hafnium oxide material layer in a first hardening apparatus at a temperature within a range of about 300° C. to about 350° C. for a first time period.

17. The method according to claim 16, wherein the first time period is within a range of about 5 minutes to about 120 minutes.

18. The method according to claim 16, wherein each of the aluminum oxide material layer and the hafnium oxide material layer are formed using one of a spin coating apparatus, a slot coating apparatus, an inkjet printing apparatus, and a mist coating apparatus.

19. The method according to claim 16, wherein forming the gate insulating layer further comprises:
    removing the first solvent from the aluminum oxide material layer by disposing the substrate having the aluminum oxide material layer in a first drying apparatus at a temperature within a range of about 240° C. to about 300° C.; and
    removing the second solvent from the hafnium oxide material layer by disposing the substrate having the hafnium oxide material layer in a second drying apparatus at a temperature within a range of about 240° C. to about 300° C.

20. The method according to claim 10, wherein the oxide semiconductor layer includes a zinc oxide material.

21. The method according to claim 20, wherein the zinc oxide material includes at least one of indium gallium zinc oxide (IGZO), zinc tin oxide (ZTO) and zinc indium oxide (ZIO).

22. The method according to claim 10, wherein forming the oxide semiconductor layer comprises:
    forming an oxide semiconductor material layer on the gate insulating layer by coating a solution including an oxide semiconductor material and a solvent using one of a spin coating apparatus, a slot coating apparatus, an inkjet printing apparatus and a mist coating apparatus;
    removing the solvent from the oxide semiconductor material layer by disposing the substrate having the oxide semiconductor material layer in a drying apparatus at a temperature within a range of about 240° C. to about 300° C.; and
    removing the solvent from the oxide semiconductor material layer by disposing the substrate having the oxide semiconductor material layer in a hardening apparatus at a temperature within a range of about 300° C. to about 350° C. for about 5 minutes to about 120 minutes.

* * * * *

UNITED STATES PATENT AND TRADEMARK OFFICE
CERTIFICATE OF CORRECTION

PATENT NO. : 8,710,497 B2  
APPLICATION NO. : 13/315049  
DATED : April 29, 2014  
INVENTOR(S) : Jung-Han Kim et al.

Page 1 of 1

It is certified that error appears in the above-identified patent and that said Letters Patent is hereby corrected as shown below:

ON THE TITLE PAGE:

At item (73), Assignees, change:

"LG Dispay Co., Ltd, Seoul (KR); Inpria Corporation, Corvallis, OR (US)"

to: --LG Display Co., Ltd., Seoul (KR); Inpria Corporation, Corvallis, OR (US)--.

Signed and Sealed this  
Thirtieth Day of September, 2014

Michelle K. Lee  
*Deputy Director of the United States Patent and Trademark Office*